United States Patent
Mayr et al.

(10) Patent No.: US 6,911,895 B2
(45) Date of Patent: Jun. 28, 2005

(54) ELECTRICAL MODULE ASSEMBLY WITH AN EXPLOSION-PROOF SWITCH

(75) Inventors: Martin Mayr, Ilmmunster (DE); Konrad Artmann, Schondorf (DE)

(73) Assignee: Hilti Aktiengesellschaft, Schaan (LI)

( * ) Notice: Subject to any disclaimer, the term of this patent is extended or adjusted under 35 U.S.C. 154(b) by 2 days.

(21) Appl. No.: 10/674,560

(22) Filed: Sep. 30, 2003

(65) Prior Publication Data

US 2004/0129442 A1 Jul. 8, 2004

(30) Foreign Application Priority Data

Oct. 2, 2002 (DE) .......................................... 102 45 952

(51) Int. Cl.$^7$ ................................................ H01C 7/04
(52) U.S. Cl. .................................. 338/32 H; 338/32 R
(58) Field of Search ................................. 361/627, 628, 361/630, 752, 600, 601, 605; 324/207.2, 207.22; 200/293–307; 338/32 R, 32 H

(56) References Cited

FOREIGN PATENT DOCUMENTS

| DE | 32 20 914 A1 | * | 8/1983 | .......... H01H/19/06 |
| DE | 195 14 708 C1 | * | 8/1996 | .......... H03K/17/965 |

* cited by examiner

Primary Examiner—Phuong T. Vu
(74) Attorney, Agent, or Firm—Sidley Austin Brown & Wood, LLP

(57) ABSTRACT

An electrical module assembly includes an electrical module located in the module housing (1) and having an explosion-proof contactless switch (4) including a movable switching element (7) and an actuation element (6) for actuating the switching element (7) from outside, and a sensory electronics (8) for sensing movement of the switch element (7), with the sensory electronics (8) being spatially separated from the switching element (7) by a separation section (9) of the wall (2) of the module housing (1).

12 Claims, 1 Drawing Sheet

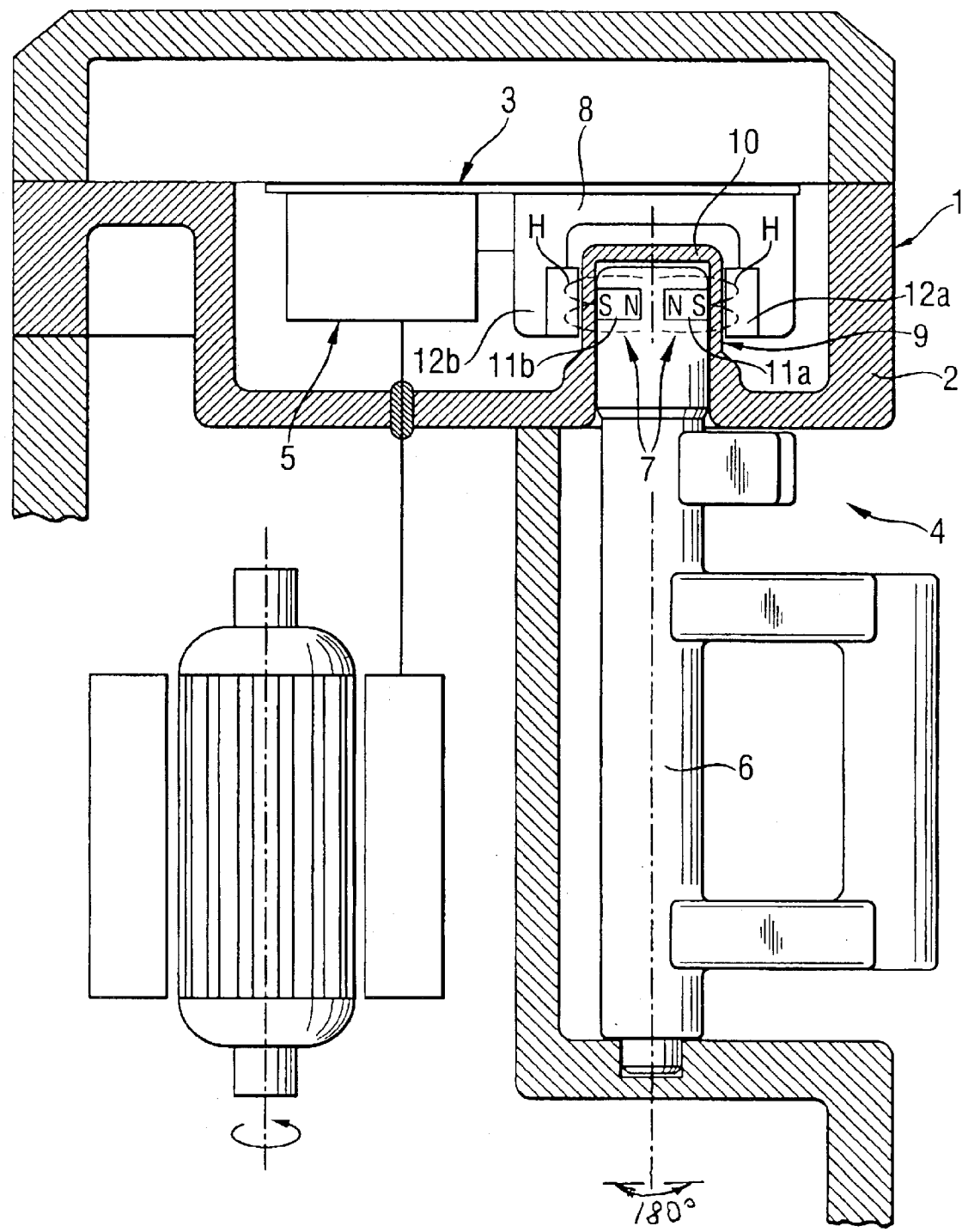

ELECTRICAL MODULE ASSEMBLY WITH AN EXPLOSION-PROOF SWITCH

BACKGROUND OF THE INVENTION

1. Field of the Invention

The present invention relates to an electrical module assembly with an explosion-proof switch and, in particular to an electrical module assembly with a motor switch for an electrical power tool.

2. Description of the Prior Art

Contemporary power tools such as, e.g., chisel hammers, include an electrical module assembly with power electronics which is arranged in a compression-proof housing with minimal gap lengths for spark-quenching, whereby the power electronics is protected from explosion. In addition, contemporary electrical power tools require the use of explosion-proof motor switches which reliably prevent formation of sparks.

Conventionally, a contactless switch includes movable switching means, e.g., permanent magnets, which is actuated by associated actuation means, and sensory electronics for detecting the relative movement of the switching means. The sensory electronics may include a Hall-sensor that controls power electronics arranged in the current circuit of the electric motor of a power tool, whereby generation of switching sparks in prevented. For the necessary electrical connection of the sensory electronics with the inner power electronics, the actuation means, which is actuated from outside and extends through an opening formed in the wall of the module housing, also should be protected from explosion. To this end, the housing opening has minimal gap lengths and maximal gap widths for quenching the sparks.

German Publication DE-195 14 708 discloses a contactless Hall-push-button switch having respective separation walls between two displaceable slides with respective permanent magnets and two associated therewith, respectively, Hall-sensors. The separation wall is formed as a hat-shaped, turned from inside out, pocket. The turned, from inside out, pocket simultaneously serves as a support for a displaceable push-slide.

German Publication DE-32 20 914 discloses an explosion-proof, contactless Hall-rotary switch having a circular bottom elevation in which an operating shaft with two diametrically opposite permanent magnets is guided, and in which the magnetic field, which passes a separation wall, acts on a Hall-element that is located in a circular chamber separated from the separation wall. The separation wall forms a component of the integral structure of the switch which is arranged on the outside of the electrical module and requires that an opening be formed in the module housing for an electrical connection with the inner power electronics.

An object of the present invention is to provide an electrical module assembly with an explosion-proof switch and the module housing of which does not have any opening.

SUMMARY OF THE INVENTION

This and other objects of the present invention, which will become apparent hereinafter, are achieved by providing an electrical module assembly including a module housing having a compression-proof wall, and an electrical module located in the module housing and having an explosion-proof contactless switch including movable switching means and an actuation element for actuating the switching means from outside, and a sensory electronics which is spatially separated from the switching means by a separation section of the wall (2) of the module housing.

By forming the separation wall of a contactless switch with a wall section of a compression-proof housing wall, the actuation means with the switching means can be located outside of the module housing, and the sensory electronics can be arranged inside the module housing. Thereby, the explosion protection and compression-resistance are insured without a need in a expensive or costly protection means.

Advantageously, the wall section is formed as a pot-shaped pocket which, advantageously, extends into the interior of the module housing and forms a pivot support for the actuation means.

Advantageously, the pocket is formed as an axially symmetrical pocket, whereby upon receiving the actuation means, a rotational degree of freedom is obtained which provides for a switching movement.

Advantageously, the actuation element is formed as a rotatable body pivotable within an angular region from 30° to 180° limited from opposite sides. Thereby, a rotary switch can be realized.

Advantageously, the switching means is arranged adjacent to an end surface of the actuation element located in the pocket, whereby a spatial distance between the switching means and the sensory electronics is reduced.

Advantageously, the switching means is arranged radially outwardly of the end surface of the actuation means, and the sensory electronics is arranged in the interior of the module housing on the outer surface of the pocket. This insures a larger switching path at a small spatial distance between the switching means and the sensory electronics.

Advantageously, the sensory electronics includes at least one Hall-sensor, and the switching means formed as a permanent magnet a magnetic field of which is associated with the Hall-sensor, whereby the switching information is defined by the absolute value of the magnetic field.

Advantageously, the Hall-sensor is formed as a differential Hall-sensor and is slightly offset relative to the permanent magnet in the actuation direction of the permanent magnet. Thereby the switching transition is detected and is transmitted without any disturbance or interference.

Advantageously, the switching means is formed of two opposite, antiparallel oriented, permanent magnets, and the sensory electronics includes two Hall-sensors associated with respective permanent magnets, with the two Hall-sensors being, preferably, seriesly connected. Thereby the switching information can be transmitted by a differential change of the absolute value of the magnetic field, with the outer magnetic field mutually canceling each other out.

Advantageously the housing wall is formed of a non-ferromagnetic material, preferably, of aluminum alloy, which insures an adequate penetration of the magnetic field therethrough.

The novel features of the present invention, which are considered as characteristic for the invention, are set forth in the appended claims. The invention itself, however, both as to its construction and its mode of operation, together with additional advantages and objects thereof, will be best understood from the following detailed description of preferred embodiments, when read with reference to the accompanying drawings.

BRIEF DESCRIPTION OF THE DRAWINGS

Single FIGURE of the drawings shows as cross-sectional view of an electrical module according to the present invention.

DETAILED DESCRIPTION OF THE PREFERRED EMBODIMENT

An electrical module 3 according to the present invention, which is located in a module housing 1, having a compression-proof wall 2, includes an explosion-proof contactless switch 4 for power electronics 5. The switch 4 includes switch means 7, which is actuated by an actuation element 6, and sensory electronics 8 that is separated from the switch means 7 by a wall section 9 of the wall 2 of the housing 1. The wall section 9 forms a pot-shaped axially symmetrical pocket 10 within the interior of the module housing 1 and in which the actuation element 6 is rotatably supported for pivoting within an angular region from 30° to 180° and, preferably, of 120° that is limited on its opposite sides. Switching means 7, which is arranged at an end surface of the actuation element 6 adjacent to the walls of the pocket 10, is formed as two opposite permanent magnets 11a, 11b having their magnetic fields acting back-to-back in opposite directions. Two differential Hall-sensors 12a, 12b, which are associated with respective permanent magnets 11a, 11b and are circumferentially offset with respect thereto, are located in the interior of the module housing 1 on the outer surface of the pocket 10. The two Hall-sensors 12a, 12b seriesly logically switch within the sensory electronics 8. The magnetic field 4, which transmit the switching information from the permanent magnets 11a, 11b to the Hall-sensors 12a, 12b, respectively, intersperses the module housing wall 2 which is formed of an aluminum alloy.

Though the present invention was shown and described with reference to the preferred embodiment, such is merely illustrative of the present invention and is not to be construed as a limitation thereof and various modification of the present invention will be apparent to those skilled in the art. It is therefore not intended that the present invention be limited to the disclosed embodiment or details thereof, and the present invention includes all variations and/or alternative embodiments within the spirit and scope of the present invention as defined by the appended claims.

What is claimed is:

1. An electrical module assembly, comprising a module housing (1) having a compression-proof wall (2); and an electrical module (3) located in the module housing (1) and having an explosion-proof contactless switch (4) including movable switching means (7) and an actuation element (6) for actuating the switching means (7) from outside, and sensory electronics (8) for sensing movement of the switch means (7), the sensory electronics (8) being spatially separated from the switching means (7) by a separation section (9) of the wall (2) housing (1), wherein the actuation element (6) pivots within an angular region from 30° to 180° and is limited from opposite sides, and wherein the sensory electronics (8) includes at least one Hall-sensor (12a, 12b) and the switching means (7) is formed as a permanent magnet (11a, 11b), a magnetic field (H) which is associated with the Hall-sensor (12a, 12b).

2. An electrical module assembly according to claim 1 wherein the separation section (9) forms a pot-shaped pocket 10.

3. An electrical module assembly according to claim 2, wherein the pot-shaped pocket (10) projects into an interior of the module housing (1).

4. An electrical module assembly according to claim 2, wherein the pot-shaped pocket (10) is formed as an axially symmetrical pocket.

5. An electrical module assembly according to claim 1, wherein the actuation element (6) is formed as a rotatable body.

6. An electrical module assembly according to claim 3, wherein the switching means (7) is arranged adjacent to an end surface of the actuation element (6) associated with the pocket (10).

7. An electrical module assembly, according to claim 6, wherein the switching means (7) is arranged radially outwardly of the end surface of the actuation means, and wherein the sensory electronics (8) are arranged in the interior of the module housing (1) on an outer surface of the pocket (10).

8. An electrical module assembly according to claim 1, wherein the Hall-sensor (12a, 12b) is formed as a differential Hall-sensor which is slightly offset relative to the permanent magnet (11a, 11b) in an actuation direction of the permanent magnet (11a, 11b).

9. An electrical module assembly according to claim 1 wherein the switching means (7) is formed by two opposite permanent magnets (11a, 11b) having magnetic fields thereof acting back-to-back in opposite direction and wherein the sensory electronics include two Hall-sensors (12a, 12b) associated with respective permanent magnets (11a, 11b).

10. An electrical module assembly according to claim 9, wherein the two Hall-sensors (12a, 12b) are seriesly connected.

11. An electrical module assembly according to claim 1, wherein the module housing (1) is formed of a non-ferromagnetic material.

12. An electrical module assembly according to claim 11, wherein the module housing (1) is formed of an aluminum alloy.

* * * * *